(12) United States Patent
Roohparvar et al.

(10) Patent No.: US 10,712,960 B2
(45) Date of Patent: *Jul. 14, 2020

(54) CONFIGURABLE OPERATING MODE MEMORY DEVICE AND METHODS OF OPERATION

(71) Applicant: MICRON TECHNOLOGY, INC., Boise, ID (US)

(72) Inventors: Frankie F. Roohparvar, Monte Sereno, CA (US); Luca De Santis, Avezzano (IT); Tommaso Vali, Sezze (IT); Kenneth J. Eldredge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/166,231

(22) Filed: Oct. 22, 2018

(65) Prior Publication Data

US 2019/0050162 A1    Feb. 14, 2019

Related U.S. Application Data

(63) Continuation of application No. 15/945,316, filed on Apr. 4, 2018, which is a continuation of application No. 13/774,688, filed on Feb. 22, 2013, now Pat. No. 9,965,208.

(Continued)

(51) Int. Cl.
*G06F 3/06* (2006.01)
*G11C 11/00* (2006.01)
(Continued)

(52) U.S. Cl.
CPC .......... *G06F 3/0634* (2013.01); *G06F 3/0626* (2013.01); *G06F 3/0632* (2013.01);
(Continued)

(58) Field of Classification Search
CPC .... G06F 3/0634; G06F 3/0626; G06F 3/0632; G06F 3/0679; G06F 3/0688;
(Continued)

(56) References Cited

U.S. PATENT DOCUMENTS

| | | |
|---|---|---|
| 4,326,259 A | 4/1982 | Cooper et al. |
| 5,751,987 A | 5/1998 | Mahant-Shetti et al. |

(Continued)

*Primary Examiner* — Reginald G Bragdon
*Assistant Examiner* — Edward Wang
(74) *Attorney, Agent, or Firm* — Dicke, Billig & Czaja, PLLC

(57) ABSTRACT

Memory devices, and methods of operating similar memory devices, include an array of memory cells comprising a plurality of access lines each configured for biasing control gates of a respective plurality of memory cells of the array of memory cells, wherein the respective plurality of memory cells for one access line of the plurality of access lines is mutually exclusive from the respective plurality of memory cells for each remaining access line of the plurality of access lines, and a controller having a plurality of selectively-enabled operating modes and configured to selectively operate the memory device using two or more concurrently enabled operating modes of the plurality of selectively-enabled operating modes for access of the array of memory cells, with each of the enabled operating modes of the two of more concurrently enabled operating modes utilizing an assigned respective portion of the array of memory cells.

20 Claims, 4 Drawing Sheets

Related U.S. Application Data

(60) Provisional application No. 61/602,364, filed on Feb. 23, 2012.

(51) Int. Cl.
*G11C 15/04* (2006.01)
*G06F 11/22* (2006.01)
*G06F 11/10* (2006.01)
*G11C 16/04* (2006.01)

(52) U.S. Cl.
CPC .......... *G06F 3/0679* (2013.01); *G06F 3/0688* (2013.01); *G11C 11/005* (2013.01); *G11C 15/046* (2013.01); *G06F 11/1064* (2013.01); *G06F 11/2263* (2013.01); *G11C 16/0483* (2013.01)

(58) Field of Classification Search
CPC ............. G06F 11/1064; G06F 11/2263; G11C 11/005; G11C 15/046; G11C 16/0483
See application file for complete search history.

(56) References Cited

U.S. PATENT DOCUMENTS

| | | | |
|---|---|---|---|
| 6,020,759 | A | 2/2000 | Heile |
| 6,400,635 | B1 | 6/2002 | Ngai et al. |
| 7,190,190 | B1 | 3/2007 | Camarota et al. |
| 2005/0056869 | A1 | 3/2005 | Ichige et al. |
| 2008/0316843 | A1 | 12/2008 | Kim |
| 2012/0155167 | A1 | 6/2012 | Uehara |
| 2012/0240012 | A1 | 9/2012 | Weathers et al. |
| 2012/0246391 | A1 | 9/2012 | Meir et al. | ly facilitate a reduction in complexity and/or component count

CONFIGURABLE OPERATING MODE MEMORY DEVICE AND METHODS OF OPERATION

RELATED APPLICATION

This application is a Continuation of U.S. patent application Ser. No. 15/945,316, titled "CONFIGURABLE OPERATING MODE MEMORY DEVICE AND METHODS OF OPERATION," filed Apr. 4, 2018, issued as U.S. Pat. No. 10,261,713 on Apr. 16, 2019, which is a Continuation of U.S. patent application Ser. No. 13/774,688, titled "CONFIGURABLE OPERATING MODE MEMORY DEVICE," filed Feb. 22, 2013, issued as U.S. Pat. No. 9,965,208 on May 8, 2018, which is incorporated by reference herein in its entirety, and which is a Non-Provisional of U.S. Provisional Patent Application Ser. No. 61/602,364, filed Feb. 23, 2012, titled "CONFIGURABLE OPERATING MODE MEMORY DEVICE," which is related to U.S. Provisional Patent Application Ser. No. 61/476,574, filed Apr. 18, 2011, titled "METHODS AND APPARATUS FOR PATTERN MATCHING," each of which is commonly assigned.

TECHNICAL FIELD

The present disclosure relates generally to memory and in particular, in one or more embodiments, the present disclosure relates to configuring and operating memory devices in one or more of a plurality of operating modes.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and Flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for Flash memory continue to expand.

Many electronic systems utilize multiple types of devices (e.g., multiple types of circuitry) to function, such as processors, logic circuitry and various types of memory. For example, many systems use programmable logic devices (PLDs). Programmable logic devices typically are semiconductor devices which are configured to perform a particular logic function in response to the configuration of the PLD device. Many electronic systems utilize various types of memory devices, such as random access memory (RAM) and read only memory (ROM.) Some examples of these memories are SRAM, DRAM, Flash and content addressable memories (CAM.)

The demand to reduce component count and reduce the physical size of electronic systems along with a demand for increased processing capability continues to increase. Thus, a reduction in the number and types of devices in electronic systems while maintaining the same functionality might facilitate a reduction in complexity and/or component count of electronic systems which might facilitate a reduction in overall system costs.

For the reasons stated above, and for other reasons stated below which will become apparent to those skilled in the art upon reading and understanding the present specification, there is a need in the art for memory devices which are configurable to operate in one or more of a plurality of operating modes previously provided by multiple types of devices in electronic systems.

DETAILED DESCRIPTION

Figure 1:
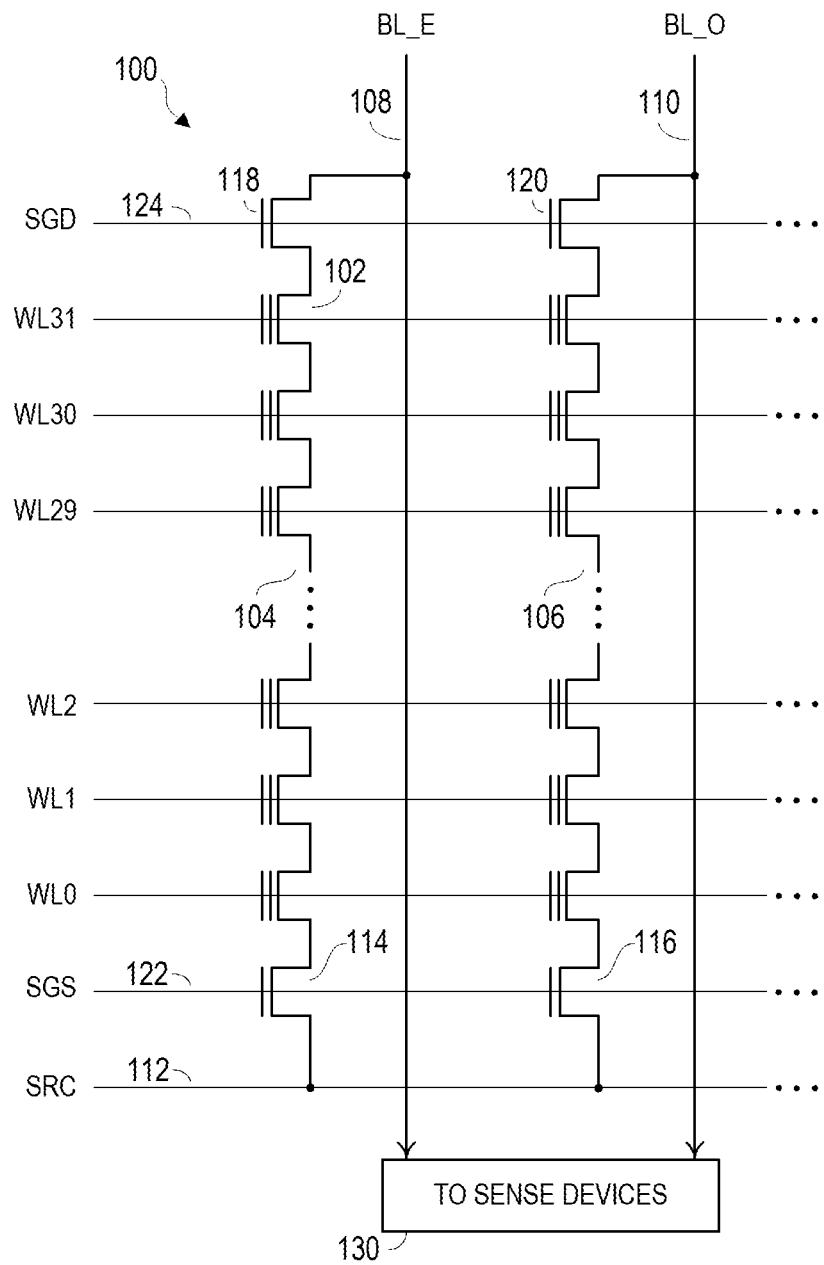
FIG. 1 illustrates a schematic representation of an array of NAND configured memory cells.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Flash memory typically utilizes one of two basic architectures known as NOR Flash and NAND Flash. The designation is derived from the logic used to read the devices. In NOR Flash architecture, a logical column of memory cells is coupled in parallel with each memory cell coupled to a data line, such as those typically referred to as digit (e.g., bit) lines. In NAND Flash architecture, a column of memory cells is coupled in series with only the first memory cell of the column coupled to a bit line.

The memory array 100 comprises an array of non-volatile memory cells 102 (e.g., floating gate) arranged in columns such as series strings 104, 106. Each of the cells is coupled drain to source in each series string 104, 106. An access line (e.g., word line) WL0-WL31 that spans across multiple series strings 104, 106 is coupled to the control gates of each memory cell in a row in order to bias the control gates of the memory cells in the row. Data lines, such as even/odd bit lines BL_E 108, BL_O 110, are coupled to the series strings and eventually coupled to sense circuitry 130 (e.g., sense devices) that detects the state of each cell by sensing current or voltage on a selected bit line. The bit lines BL_E 108, BL_O 110 are also coupled to page buffers (not shown) that can be programmed by data from each selected word line.

The sense circuitry and page buffers may be part of the same circuitry or the page buffers can be separate circuitry.

Each series string 104, 106 of memory cells is coupled to a source line 112 by a source select gate 114, 116 (e.g., transistor) and to an individual even or odd bit line BL_E, BL_O by a drain select gate 118, 120 (e.g., transistor). The source select gates 114, 116 are controlled by a source select gate control line SGS 122 coupled to their control gates. The drain select gates 118, 120 are controlled by a drain select gate control line SGD 124.

In a typical programming of the memory array, each memory cell is individually programmed as either a single level cell (SLC) or a multiple level cell (MLC). The cell's threshold voltage ($V_t$) can be used as an indication of the data stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multiple level cells can take advantage of the analog nature of a traditional charge storage cell by assigning a bit pattern to a specific $V_t$ range.

Figure 2:
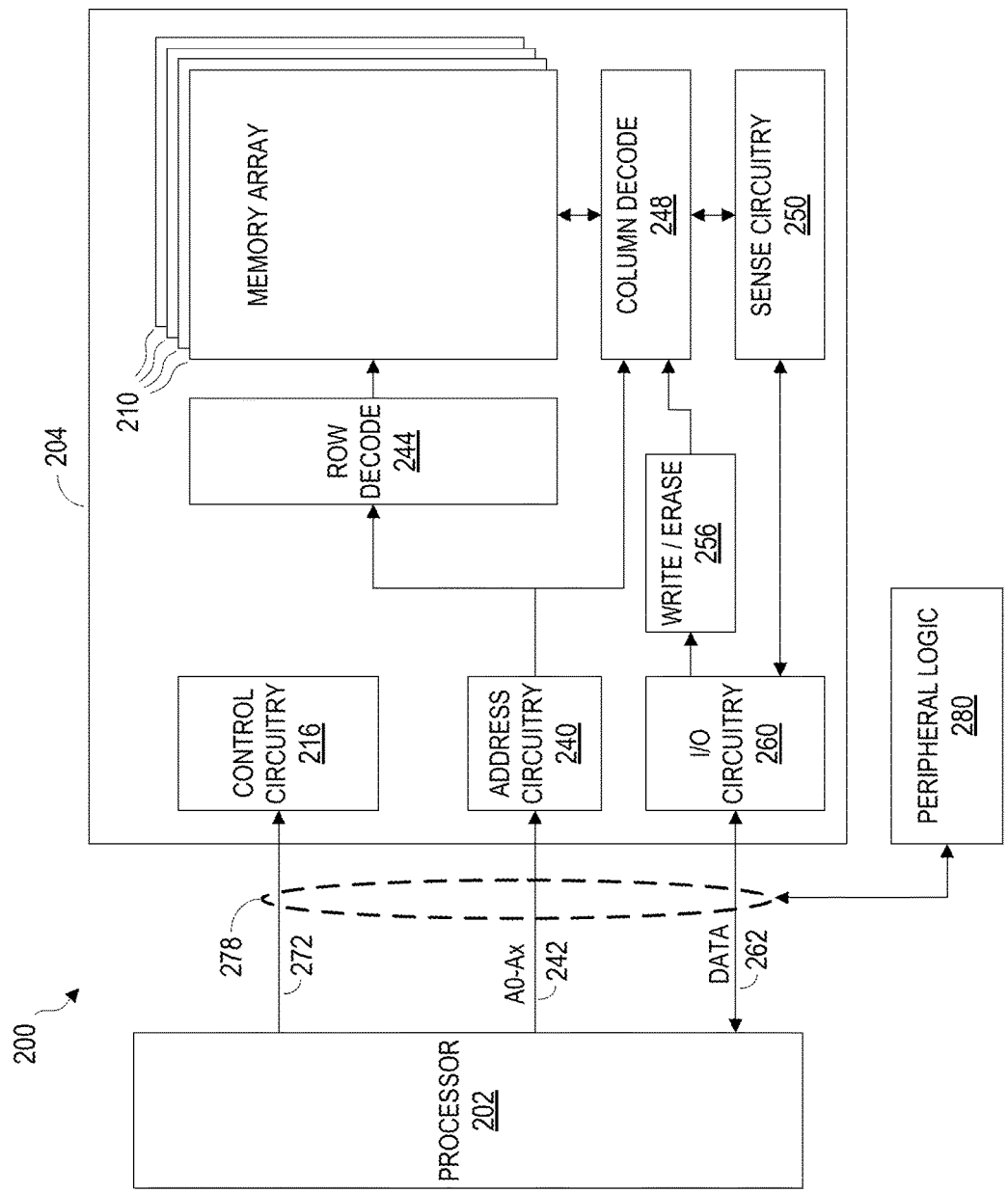
FIG. 2 is simplified block diagram of a typical memory device coupled to a memory access device as part of an electronic system.

FIG. 2 illustrates a block diagram of a typical electronic system 200 comprising a memory access device 202 (e.g., processor), a memory device 204 and one or more peripheral devices 280. The memory device 204 of FIG. 2 includes an array of memory cells 210, such as an array of charge storage memory cells, for example. The memory device 204 comprises additional circuitry, such as control circuitry 216, input/output (I/O) circuitry 260, address circuitry 240, write/erase circuitry 256, row decode 244 and column 248 decode circuitry and sense circuitry 250. The memory device 204 might be coupled to the memory access device 202 by an interface 278 which comprises one or more communications channels, such as control lines 272, address lines 242 and data lines 262.

FIG. 2 further illustrates one or more peripheral devices 280 that might be included in the electronic system of FIG. 2. These peripheral devices 280 (e.g., peripheral logic) might be coupled to one or more of the communications channels (e.g., 272, 242, 262) comprising the interface 278, for example. These peripheral devices can increase the complexity and cost of the electronic system. Further, some of these peripheral devices have fixed configurations that are application specific and cannot be reconfigured. For example, the peripheral device 280 might comprise a programmable logic device (PLD), for example. Memory devices according to one or more embodiments of the present disclosure facilitate incorporating the functionality of one or more of these peripheral devices within a memory device of the electronic system.

Figure 3:
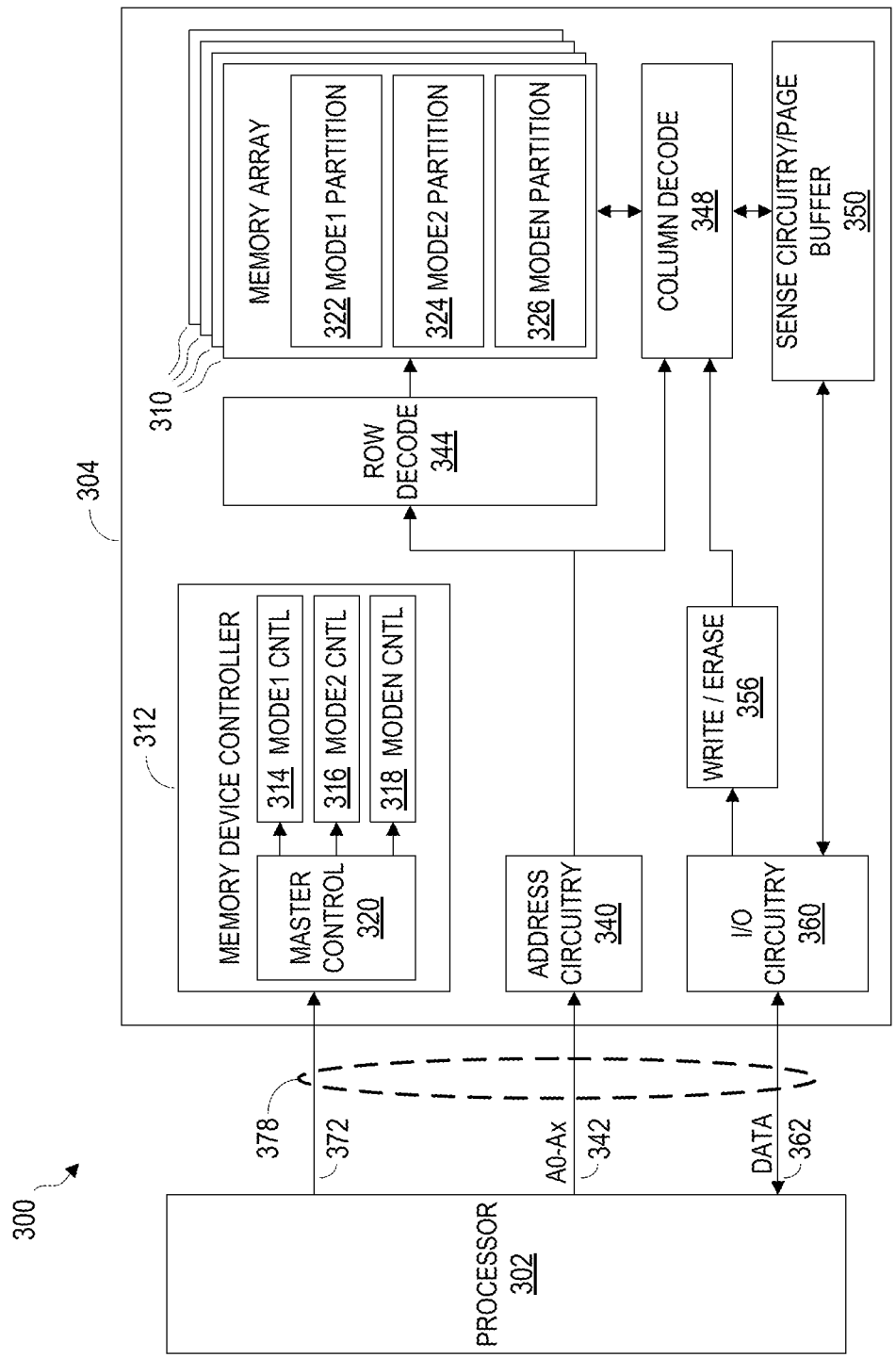
FIG. 3 is a simplified block diagram of a memory device coupled to a memory access device as part of an electronic system according to an embodiment of the present disclosure.

FIG. 3 is a functional block diagram of an electronic system 300 having at least one memory device 304 according to one or more embodiments of the present disclosure. The memory device 304 illustrated in FIG. 3 is coupled to a memory access device 302, such as a processor. The memory access device 302 might be a microprocessor or some other type of controlling circuitry. The memory access device 302 is coupled to the memory device 304 by an interface 378. The interface 378 comprises one or more communications channels, such as command lines 372, address lines 342 and/or data lines 362. The interface 378 might comprise a number of standard interfaces, such as a Universal Serial Bus (USB) interface, for example. The interface 378 might be a standard interface used with many hard disk drives (e.g., SATA, PATA) as are known to those skilled in the art. Together, the memory device 304 and the processor 302 form part of the electronic system 300. The memory device 304 has been simplified to focus on features of the memory device that are helpful in understanding various embodiments of the present disclosure.

The memory device 304 includes one or more arrays of memory cells 310 that can be logically arranged in rows and columns. According to one or more embodiments, the memory cells of memory array 310 are charge storage memory cells having a NAND array configuration. The memory array 310 can include multiple banks, blocks, pages and strings (e.g., NAND strings) of memory cells residing on a single or multiple die as part of the memory device 304. Memory array 310 might comprise SLC and/or MLC memory. The memory array 310 might also be adaptable to store varying densities (e.g., MLC (four level) and MLC (eight level)) of data in each cell, for example.

An address buffer circuit 340 is provided to latch address signals provided on address input channels A0-Ax 342. Address signals are received and decoded by the row decoder 344 and the column decoder 348 to access the memory array 310. Row decoder 344 might comprise driver circuits (not shown) configured to drive the word lines of the memory array 310, for example. Row decoder 344 might comprise row buffer circuits (not shown). The driver circuits of the row decoder 344 might be configured to drive the word lines of the memory array 310 responsive to data stored in the row buffer circuits, for example. It will be appreciated by those skilled in the art, with the benefit of the present description, that the number of address input channels 342 might depend on the density and architecture of the memory array 310. That is, the number of address digits increase with both increased memory cell counts and increased bank and block counts, for example.

The memory device 304 reads data in the memory array 310 by sensing voltage or current changes in the memory array columns using sense circuitry 350. The sense circuitry/ page buffer 350, in at least one embodiment, is coupled to read and latch a row of data from the memory array 310. The sense circuitry/page buffer 350 can move data to the row buffer circuits (not shown) as well. Data input and output (I/O) buffer circuitry 360 is included for bi-directional data communication over one or more data channels 362 with the processor 302. Write/erase circuitry 356 is provided to write data to or to erase data from the memory array 310.

Control signals and commands can be sent by the processor 302 to the memory device 304 over the command communication channels (e.g., bus) 372. The command bus 372 may be a discrete signal line or may be comprised of multiple signal lines, for example. Signals on the command bus 372 are used to control the operations on the memory array 310, including data read, data write (e.g., program), and erase operations.

A controller 312 of the memory device 304 is configured, at least in part, to implement various embodiments of the present disclosure. Memory device controller 312 can comprise, for example, control circuitry (such as control circuitry 216), firmware and/or software. Controller 312 might be coupled (not shown) to one or more of the elements of the memory device 304. According to one or more embodiments, controller 312 and/or firmware or other circuitry can individually, in combination, or in combination with other elements of the memory device 304, form an internal controller. As used herein, however, a controller need not necessarily include any or all of such components. In some embodiments, a controller can comprise an internal controller (e.g., located on the same die as the memory array) and/or an external controller. In at least one embodiment, the control circuitry 312 may utilize a state machine.

Memory device controller 312 might be configured to operate the memory device 304 in one or more of a plurality of operating modes. For example, the memory device 304 might be at least partially or wholly configured to function as a memory device (e.g., a standard memory storage device) wherein data (e.g., user data) is stored in the memory array and is accessed and output in response to a write and/or read request from the memory access device 302 coupled to the memory device 304. Memory device controller 312 might be configured to facilitate moving data within the memory device, such as from the page buffer 350 to the row buffers as discussed above, for example. The memory device controller might be configured to facilitate moving data into and/or out of the memory device 304, such as in communicating with the processor 302, for example. The memory device 304 can be configured to program memory cells of the memory array 310 as SLC and/or MLC memory.

The memory device 304 of FIG. 3 may be further configured to operate in one or more other operating modes in addition to a user data storage operating mode according to various embodiments of the present disclosure. These operating modes facilitate functions which might have previously been performed by peripheral devices, such as peripheral device 280, discussed above with respect to FIG. 2, for example. One of these additional modes of operation can comprise at least a portion of the memory device 304 being configured to operate as a Programmable Logic Device (PLD.) A description of an implementation of a PLD within a memory device, such as in a NAND Flash memory device, is disclosed in U.S. Provisional Patent Application Ser. No. 61/602,249, filed Feb. 23, 2012, titled "MEMORY AS A PROGRAMMABLE LOGIC DEVICE," which is commonly assigned. A portion of the memory device controller 312 of memory device 304, such as MODE1 CNTL 314 may be configured to facilitate operating at least a portion of the memory device 304 in a PLD operating mode, for example.

According to one or more embodiments of the present disclosure, the memory device 304 can be at least partially configured as a content addressable memory (CAM) memory device. For example, a portion of the memory device controller 312, such as MODE2 CNTL 316, can be configured to facilitate operating at least a portion of the memory device 304 in a CAM operating mode. Such a memory device operating mode might be utilized to perform pattern matching operations, for example. A description of an implementation of a CAM device, such as implemented in a NAND Flash memory device, is disclosed in U.S. Provisional Application No. 61/476,574, filed Apr. 18, 2011, which is commonly assigned.

A CAM operating mode of the memory device 304 according to one or more embodiments of the present disclosure might comprise a number of different CAM operating modes. For example, the memory device 304, at least in part, can be configured as a Memory Read Compare and/or a Parallel Compare Mode CAM device. In the Memory Read Compare configuration, a particular input (e.g., feature vector or key) is compared to data stored in particular memory locations within the memory array 310 (e.g., a data vector) to attempt to determine if a match exists between stored data and the particular input. A Parallel Compare Mode configuration can be used to facilitate comparisons responsive to a particular type of feature vector, for example. Feature vectors might be generated by a memory access device 302 and transmitted over one or more communications channels of the interface 378 as an input to the memory device 304, for example.

Weighting functions, such as utilized by a CAM device, can be implemented within a memory device 304 according to various embodiments of the present disclosure. A description of weighting functions, such as implemented in a NAND configured Flash memory device, is disclosed in U.S. Provisional Patent Application Ser. No. 61/587,337, filed Jan. 17, 2012, titled "COMPARISON OF VECTORS AND WEIGHTED DISTANCE CALCULATION IN A MEMORY DEVICE," and U.S. Provisional Patent Application Ser. No. 61/625,286, filed Apr. 17, 2012, titled "MEMORY DEVICES CONFIGURED TO APPLY DIFFERENT WEIGHTS TO DIFFERENT STRINGS OF MEMORY CELLS COUPLED TO A DATA LINE AND METHODS," which are commonly assigned. Additional embodiments utilize 'don't care' functions with regard to an incoming feature vector and/or to data that might be stored in the memory array 310. A description of implementing 'don't care' functions, such as utilized in a NAND configured Flash memory device, is disclosed in U.S. Provisional Patent Application Ser. No. 61/625,283, filed Apr. 17, 2012, titled "USING DO NOT CARE DATA WITH FEATURE VECTORS," which is commonly assigned.

Memory devices 304 according to various embodiments of the present disclosure can be configured to, at least in part, facilitate operating at least a portion of the memory device in a neural network operating mode. A description of implementing a neural network in a memory device, such as in a NAND configured Flash memory device, is disclosed in U.S. Provisional Patent Application Ser. No. 61/602,344, filed Feb. 23, 2012, titled "NEURAL NETWORK IN A MEMORY DEVICE," which is commonly assigned.

Memory device controller 312 might comprise additional control circuitry, such as Master Control circuitry 320, in addition to the operating mode specific control circuitry 314-318, for example. The master control circuitry 320 is configured to facilitate various operations within the memory device, such as read, write and erase operations, for example. Master control circuitry 320 can comprise, for example, firmware and/or software. The master control circuitry 320 also manages the various operating modes of the memory device 304 by enabling and/or disabling one or more operating modes of the memory device 304. MODE1 CNTL control circuitry 314 might be enabled which facilitates a user data storage operating mode whereas MODE2 CNTL control circuitry 316 might be enabled which facilitates a PLD operating mode in the memory device, for example.

The master control circuitry 320 can enable and/or disable various operating modes within the memory device responsive to commands received from the processor 302, for example. Thus, according to various embodiments of the present disclosure, the master control circuitry 320 might enable and/or disable the MODE1 CNTL 314-MODEN CNTL 318 control circuitry responsive to a particular operating mode that has been selected for the memory device 304. For example, a user might select that the memory device 304 is to operate in both a user data storage and CAM operating mode. However, various embodiments according to the present disclosure are not limited to two operating modes. For example, the memory device 304 can be configured to operate solely in one of the operating modes discussed above (e.g., user data storage, CAM, PLD, etc.). According to additional embodiments, the memory device may be configured to operate in two or more operating modes, for example.

FIG. 3 illustrates MODE1 CNTL, MODE2 CNTL and MODEN CNTL as separate blocks of circuitry. However, according to various embodiments, control circuitry of the memory device controller 312 might be utilized by more than one portion of the mode control circuitry (e.g., MODE1 CNTL, MODE2 CNTL and MODEN CNTL). For example, MODE1 CNTL control circuitry and MODE2 CNTL control circuitry might both utilize a common group of data registers to facilitate their respective operating modes, for example. MODE1 CNTL-MODEN CNTL can comprise, for example, firmware and/or software. In addition, two or more different operating modes might utilize the same control circuitry of the memory device controller. MODE1 CNTL 314 might be configured to facilitate a PLD operating mode and a CAM operating mode in the memory device, for example. The memory device controller 312 might be further configured to independently control word line drivers of the memory device.

Memory array 310 might be allocated into one or more portions (e.g., partitions) according to various embodiments of the present disclosure. Each portion (e.g., partition) 322-326 of the memory array 310 is associated with a selected operating mode in order to facilitate the functionality of the selected operating modes. FIG. 3 illustrates partitions MODE1 PARTITION-MODEN PARTITION 322-326 which correspond with the control circuitry MODE1 CNTL-MODEN CNTL 314-318, respectively. Thus, an operating mode associated with control circuitry MODE1 CNTL 314 utilizes the memory array partition MODE1 PARTITION 322, an operating mode associated with control circuitry MODE2 CNTL 316 utilizes the memory array partition MODE2 PARTITION 324, etc. The one or more partitions 322-326 need not be the same size and can be reallocated according to various embodiments of the present disclosure. Each partition 322-326 associated with each operating mode might be assigned by particular strings, pages, blocks or different memory array die within the memory device, for example.

The number of partitions of the memory array may be a different number than that of the possible operating modes for a memory device according to various embodiments of the present disclosure. For example, a memory device according to various embodiments which may be configurable into four operating modes will not necessarily be allocated into four partitions. The number of memory array partitions might match the number of operating modes that the memory device has been configured to operate in at any given time. Alternatively, more than one partition can be associated with a particular operating mode. A memory device configured to operate in one operating mode might comprise a memory array having one or more partitions associated with the one operating mode. Should the memory device be reconfigured to operate in three modes, the array can be reallocated into three partitions to facilitate the three operating modes, for example.

Operation of a memory device according to one or more embodiments of the present disclosure is further described by way of example. A memory device, such as memory device 304, may be configured to operate in a user data storage operating mode, a PLD operating mode and a CAM operating mode. A memory access device (e.g., host), such as processor 302, may wish to perform a user data storage operation in the memory device, such as a read operation, for example. The processor 302 might transmit an address of a particular memory location in the memory array partition associated with the user data storage operating mode. Further, the processor 302 might transmit a command indicating to the memory device 304 that a user data memory partition access is desired. Thus, the memory device controller 312 facilitates a read operation responsive to the received read command and the received address from the processor 302. The memory device 304 then transfers the data read from the particular address location on the data lines 362 to the processor 302, for example.

Continuing with the present example, the processor might wish to perform a PLD operation within the memory device 304. The processor 302 might transmit a particular command to the memory device 304 over the command bus 372 which indicates a PLD operation is desired. The processor 302 might further transfer data over the data lines 362 to the memory device 304. The data is to be acted upon by one or more PLD logic functions facilitated by the programmed state of one or more memory cells of the memory array partition associated with the PLD operating mode. The data might comprise a data pattern, such as a bit pattern or a pattern representative of the bit pattern. The memory device controller 312 can be configured to apply the data pattern to one or more word lines coupled to memory cells of the PLD partition of the memory array. The memory device can be further configured to generate a logical function result responsive to the data pattern applied to the word lines and the programmed states of the memory cells. This logical function result may be transferred from the memory device 304 to the processor 302 according to one or more embodiments of the present disclosure. According to one or more additional embodiments, the logical function result might comprise a data pattern to be applied to a different partition of the memory array resulting in a second logical function result which may be transferred to the processor 302, for example.

Continuing with the present example, the processor 302 might wish to perform a CAM operation within the memory device 304. The processor 302 might transmit a command to the memory device 304, such as over the command bus 372, to indicate a CAM operating mode operation is desired. The processor 302 might further transmit a data pattern associated with the command to the memory device 304 over the data bus 362. Memory device controller 312 of the memory device responds to the CAM operating mode command and the data pattern received over the data bus 362. The memory device controller 312 accesses the particular partition of the memory array associated with the CAM operating mode of the memory device. The memory device controller facilitates a comparison of the received data pattern with data stored in the CAM partition of the memory array. The memory device might further indicate whether a partial and/or complete match has been made between the data pattern and data stored in the associated partition of the memory array. For example, the memory device may transmit to the processor 302 an indication whether a match was found and/or an address in the CAM partition indicating where the match occurred. It should be noted that, according to one or more embodiments, a particular partition of the memory array is only accessed responsive to performing a particular function associated with a particular operating mode. For example, in performing a function associated with the CAM operating mode, only memory array partitions associated with the CAM operating mode are accessed.

Figure 4:
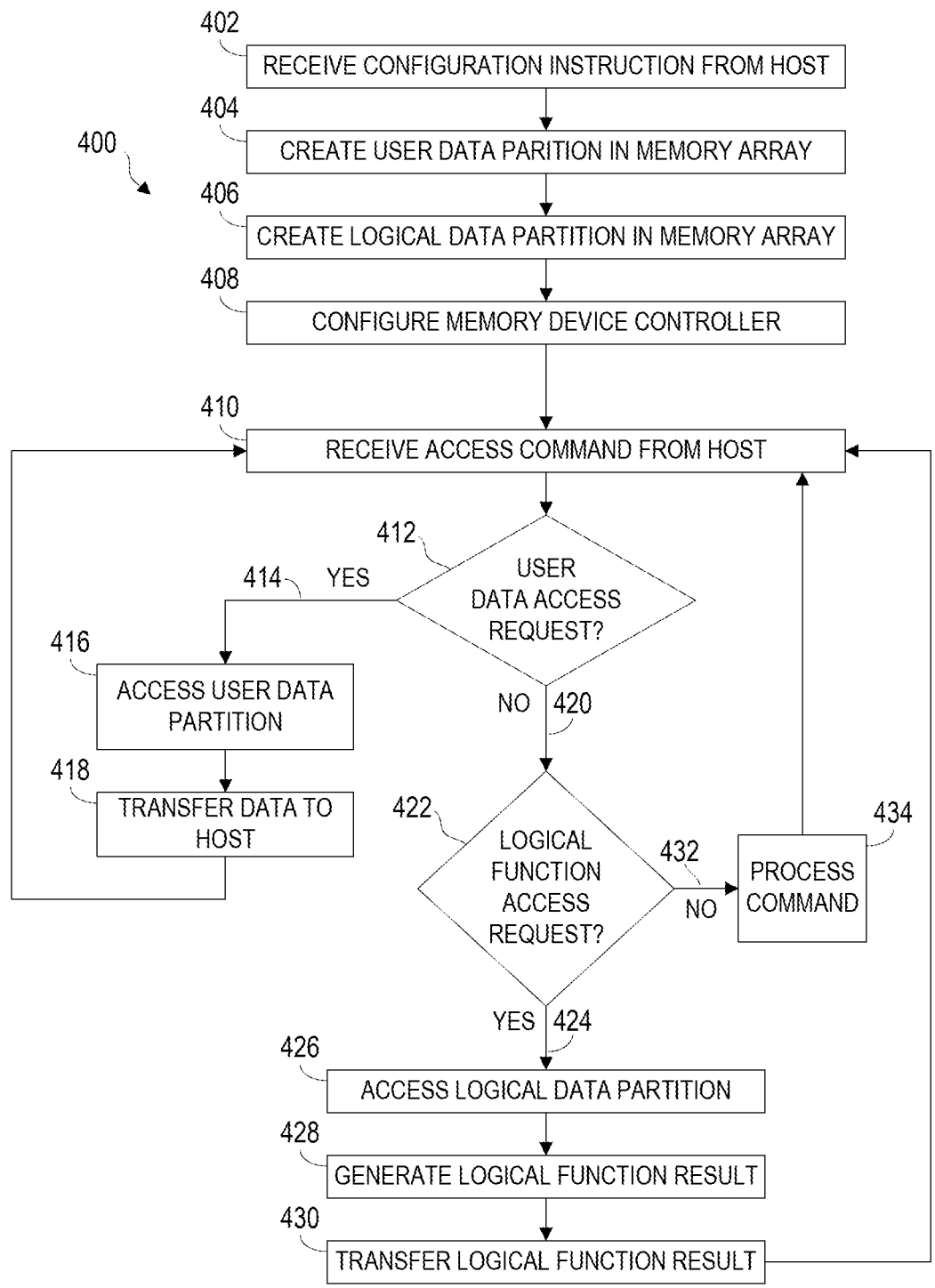
FIG. 4 is a flowchart illustrating a method of operating a memory device according to an embodiment of the present disclosure.

FIG. 4 illustrates a flowchart 400 of a method of operating a memory device according to an embodiment of the present disclosure. A memory device, such as memory device 304, might receive a configuration instruction from a host 402 coupled to the memory device. The received configuration instruction might comprise an indication of one or more selected operating modes (e.g., user data storage, PLD, CAM, neural network, etc.) for the memory device to be configured to operate in. Responsive to receiving the configuration instruction, a user data partition of the memory array of the memory device might be created 404. A logical data partition of the memory array might be created 406 to store data corresponding to one or more logical functions, for example. The memory device controller 312 might be at least partially configured 408 to operate the memory device in the selected operating modes indicated by the received configuration instruction.

Following configuration of the memory device, an access command might be received 410 by the memory device from the host. The memory device controller determines 412 if the received access command comprises a request to access the user data partition of the memory device. If the access command indicates access to the user data partition is desired 414, the memory device controller accesses the user data partition 416 and performs the specific operation to be performed. For example, the user data partition access request may be associated with a user data programming (e.g., write) operation to be performed in the user data partition. A user data partition access request might also comprise a user data read operation to be performed. The memory device controller might facilitate the read request and transfer the data read from the user data partition to the host 418.

If the received access command 410 does not comprise a user data partition access request 420, a determination is made 422 if the received access command comprises a logical function access request, such as to access a logical data partition of the memory array, for example. The received access command might not correspond to an access request to access the logical data partition 432. The memory device controller might then process the received access command 434 in response to the received command. For example, the received access command might comprise one or more additional commands related to memory device operation not specific to accessing the user data partition or the logical data partition of the memory device. Such commands might include initialization commands, device status (e.g., ready/busy) requests, etc.

If the received access command corresponds to a logical data partition access request 424, the memory device controller facilitates an access of the logical data partition 426. The received access command might comprise a data pattern (e.g., bit pattern). The memory device controller generates a logical function result 428 responsive to the received data pattern and data stored in the logical data partition. The memory device controller then facilitates a transfer of the logical function result to the host 430.

A first operating mode of the memory device can use a second operating mode of the memory device according to various embodiments of the present disclosure. Referring again to FIG. 3, the memory device 304 can be configured such that a first portion of the memory device configured to operate in a first operating mode can access and/or otherwise interact with a second portion of the memory device which is configured to operate in a second operating mode. Memory device control circuitry facilitating a neural network operational mode of the memory device can be configured to interact with control circuitry of the memory device which may be facilitating a CAM operation mode within the same memory device, for example. Further, the memory device might receive input data from a processor as discussed above. The memory device controller 312 might store (e.g., temporarily store) the input data in a user data storage partition of the memory array until it is retrieved to be utilized by a PLD operating mode of the memory device, for example. A logical function result, such as generated by a PLD or a CAM operating mode of the memory device might be stored (e.g., buffered) in the user data storage partition of the memory array. At a later time, the logical function result stored in the user data partition of the array can be transferred from the memory device 304, such as responsive to a request from a processor coupled to the memory device, for example.

It should be noted that the memory device 304 can be configured to concurrently operate in one or more operating modes. Programming particular memory cells and/or partitions of memory cells associated with each operating mode might comprise performing a common programming operation (e.g., to facilitate threshold voltage shift.) For example, a programming operation to adjust a threshold voltage of a memory cell in a PLD partition of the memory device might be the same programming operation to adjust a threshold voltage of a memory cell in a CAM partition of the memory device. Thus, memory cells might experience similar biasing conditions to shift their respective threshold voltages during programming. However, the resulting threshold voltages of the various memory cells may vary between the different partitions of the memory device. CAM memory cells may be programmed as SLC memory cells whereas the user storage memory cells may be programmed as MLC memory cells, for example.

Further, memory device controller 312 facilitates a re-configuration of the memory device 304 according to one or more embodiments of the present disclosure. The memory device 304 might have a first selected configuration of operational modes. At a different time, the memory device 304 might be re-configured to have a second selected configuration of operational modes. The re-configured memory device (e.g., configured in the second configuration) might comprise different operating modes than the first configuration. Alternatively, the second configuration might facilitate the same operating modes but utilize different portions of the memory array. For example, the first configuration may comprise a user data storage operating mode and a CAM operating mode. It might be determined that more space in the memory array is desired to serve as user data storage space and less space in the array is desired to support the CAM operating mode. Thus, a memory device according to one or more embodiments can be re-configured to have the same operating modes yet have a different allocation of memory array space assigned to each operating mode, for example.

A memory device according to various embodiments might also be configured to have two or more of the same type of operating modes but with different associated functions. For example, a memory device can be configured to facilitate two different PLD functions within the memory device. For example, control circuitry MODE1 CNTL 314 and MODE1 PARTITION 322 might be configured to facilitate a first PLD logical function. Control circuitry MODE2 CNTL 316 and MODE2 PARTITION 324 might be configured to facilitate a second PLD logical function.

Although not shown in FIG. 3, more than one memory device according to various embodiments of the present disclosure, such as memory device 304, might be coupled to the communications channels 378 of the electronic system 300. A first memory device may be configured to operate in one or more of a plurality of operating modes and a second memory device may be configured to operate in one or more of a plurality of operating modes. The configuration of the first and the second memory devices might be the same or might be different according to various embodiments of the present disclosure. Further, as discussed above, the first and the second memory devices might be reconfigurable to facilitate different operating modes at different times, for example. Although references have been made to one or more embodiments according to the present disclosure utilizing Flash memory, various embodiments are not so limited.

CONCLUSION

Memory devices configurable into one or more of a plurality of operating modes and methods of operating such configurable memory devices have been described. In particular, NAND memory devices, for example might be configurable to operate concurrently in a user data storage mode and one or more different operating modes. Such memory devices can be configured to store user data and to facilitate functionality of programmable logic devices and/or content addressable memory devices, for example.

Although specific embodiments have been illustrated and described herein, it will be appreciated by those of ordinary skill in the art that any arrangement, which is calculated to achieve the same purpose, may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:
an array of memory cells comprising a plurality of access lines, wherein each access line of the plurality of access lines is configured for biasing control gates of a respective plurality of memory cells of the array of memory cells, and wherein the respective plurality of memory cells for one access line of the plurality of access lines is mutually exclusive from the respective plurality of memory cells for each remaining access line of the plurality of access lines; and
a controller having a plurality of selectively-enabled operating modes;
wherein the controller is configured to operate the memory device using two or more concurrently enabled operating modes of the plurality of selectively-enabled operating modes for access of the array of memory cells, with each of the enabled operating modes of the two or more concurrently enabled operating modes utilizing an assigned respective portion of the array of memory cells; and
wherein one operating mode of the plurality of selectively-enabled operating modes is a user data storage operating mode that stores data in response to a write request received by the memory device and outputs data in response to a read request received by the memory device, and each remaining operating mode of the plurality of selectively-enabled operating modes is an operating mode other than the user data storage operating mode; and
wherein the plurality of selectively-enabled operating modes comprises a number of operating modes greater than or equal to three.

2. The memory device of claim 1, wherein the assigned respective portion of the array of memory cells for each of the enabled operating mode of the two or more concurrently enabled operating modes utilizes a corresponding respective subset of access lines of the plurality of access lines.

3. The memory device of claim 1, wherein the assigned respective portion of the array of memory cells for one enabled operating mode of the two or more concurrently enabled operating modes is mutually exclusive from the assigned respective portion of the array of memory cells for each remaining enabled operating mode of the two or more concurrently enabled operating modes.

4. The memory device of claim 1, wherein the array of memory cells is a first array of memory cells and the plurality of access lines is a first plurality of access lines, the memory device further comprising:
a second array of memory cells, different from the first array of memory cells, comprising a second plurality of access lines, wherein each access line of the second plurality of access lines is configured for biasing control gates of a respective plurality of memory cells of the second array of memory cells, and wherein the respective plurality of memory cells for one access line of the second plurality of access lines is mutually exclusive from the respective plurality of memory cells for each remaining access line of the second plurality of access lines;
wherein the controller is further reconfigurable to operate the memory device using one enabled operating mode of the plurality of selectively-enabled operating modes for access of the first array of memory cells and to operate the memory device using a different enabled operating mode of the plurality of selectively-enabled operating modes for access of the second array of memory cells.

5. The memory device of claim 1, wherein the controller is reconfigurable to operate the memory device using different sets of concurrently enabled operating modes of the plurality of selectively-enabled operating modes at different times.

6. The memory device of claim 1, wherein the controller is further reconfigurable to operate the memory device using only one enabled operating mode of the plurality of selectively-enabled operating modes.

7. The memory device of claim 1, wherein the controller is further configured to store input data for one enabled operating mode of the plurality of selectively-enabled operating modes in a portion of the array of memory cells assigned to a different enabled operating mode of the plurality of selectively-enabled operating modes.

8. The memory device of claim 1, wherein the controller is further configured to store output data for one enabled operating mode of the plurality of selectively-enabled operating modes in a portion of the array of memory cells assigned to a different enabled operating mode of the plurality of selectively-enabled operating modes for transfer out of the memory device.

9. The memory device of claim 1, further comprising:
wherein one operating mode of the plurality of selectively-enabled operating modes is configured to provide access to data of the memory device for providing output of that accessed data from the memory device; and
wherein a different operating mode of the plurality of selectively-enabled operating modes is configured to provide access to data of the memory device for providing output of information from the memory device that is different from that accessed data and is responsive to that accessed data.

10. The memory device of claim 9, wherein the different operating mode of the plurality of selectively-enabled operating modes is configured to provide access to data of the memory device for providing output of a logical function result of that accessed data.

11. A method of operating a memory device, comprising:
enabling a first operating mode of a plurality of selectively-enabled operating modes of the memory device for access of a first portion of an array of memory cells of the memory device, wherein the array of memory cells comprises a plurality of access lines, wherein each access line of the plurality of access lines is configured for biasing control gates of a respective plurality of memory cells of the array of memory cells, and wherein the respective plurality of memory cells for one access line of the plurality of access lines is mutually exclusive from the respective plurality of memory cells for each remaining access line of the plurality of access lines; and
enabling a second operating mode of the plurality of selectively-enabled operating modes for access of a second portion of the array of memory cells, wherein the second operating mode is different from the first operating mode, and wherein the second portion is different from the first portion; and
concurrently operating the memory device utilizing the first operating mode and the second operating mode;
wherein one operating mode of the plurality of selectively-enabled operating modes is a user data storage operating mode that stores data in response to a write request received by the memory device and outputs data in response to a read request received by the memory device, and each remaining operating mode of the plurality of selectively-enabled operating modes is an operating mode other than the user data storage operating mode; and
wherein the plurality of selectively-enabled operating modes comprises a number of operating modes greater than or equal to three.

12. The method of claim 11, wherein concurrently operating the memory device utilizing the first operating mode and the second operating mode comprises operating the memory device utilizing the first operating mode to output data from the memory device corresponding to data stored in the first portion of the array of memory cells and operating the memory device utilizing the second operating mode to output information from the memory device responsive to accessed data stored in the second portion of the array of memory cells, but different from that access data.

13. The method of claim 11, further comprising:
after concurrently operating the memory device utilizing the first operating mode and the second operating mode, enabling a third operating mode of the plurality of selectively-enabled operating modes for access of a respective portion of the array of memory cells.

14. A memory device, comprising:
an array of memory cells comprising a plurality of access lines, wherein each access line of the plurality of access lines is configured for biasing control gates of a respective plurality of memory cells of the array of memory cells, and wherein the respective plurality of memory cells for one access line of the plurality of access lines is mutually exclusive from the respective plurality of memory cells for each remaining access line of the plurality of access lines; and
a controller having a plurality of selectively-enabled operating modes;
wherein the controller is configured to operate the memory device using two or more concurrently enabled operating modes of the plurality of selectively-enabled operating modes for access of the array of memory cells, with each of the enabled operating modes of the two or more concurrently enabled operating modes utilizing an assigned respective portion of the array of memory cells;
wherein the controller is reconfigurable to operate the memory device using only one enabled operating mode of the plurality of selectively-enabled operating modes;
wherein one operating mode of the plurality of selectively-enabled operating modes is a user data storage operating mode that stores data in response to a write request received by the memory device and outputs data in response to a read request received by the memory device, and each remaining operating mode of the plurality of selectively-enabled operating modes is an operating mode other than the user data storage operating mode.

15. The memory device of claim 14, further comprising:
wherein the controller is further configured to store input data for one enabled operating mode of the plurality of selectively-enabled operating modes in a portion of the array of memory cells assigned to a different enabled operating mode of the plurality of selectively-enabled operating modes; and
wherein the controller is further configured to store output data for one enabled operating mode of the plurality of selectively-enabled operating modes in a portion of the array of memory cells assigned to a different enabled operating mode of the plurality of selectively-enabled operating modes for transfer out of the memory device.

16. The memory device of claim 15, wherein the controller being configured to store the input data for one enabled operating mode of the plurality of selectively-enabled operating modes in the portion of the array of memory cells assigned to a different enabled operating mode comprises the controller being configured to store the input data for one enabled operating mode of the plurality of selectively-enabled operating modes in a portion of the array of memory cells assigned to a user data storage operating mode.

17. The memory device of claim 15, wherein the controller being configured to store the output data for one enabled operating mode of the plurality of selectively-enabled operating modes in the portion of the array of memory cells assigned to a different enabled operating mode comprises the controller being configured to store the output data for one enabled operating mode of the plurality of selectively-enabled operating modes in a portion of the array of memory cells assigned to a user data storage operating mode.

18. The memory device of claim 17, wherein the controller being configured to store the output data for one enabled operating mode of the plurality of selectively-enabled operating modes in the portion of the array of memory cells assigned to the user data storage operating mode comprises the controller being configured to store a logical function result for one enabled operating mode of the plurality of selectively-enabled operating modes in the portion of the array of memory cells assigned to the user data storage operating mode.

19. The memory device of claim 14, wherein the controller is further configured to operate the memory device using the two or more concurrently enabled operating modes with each of the enabled operating modes of the two or more concurrently enabled operating modes utilizing an assigned respective portion of the array of memory cells that is mutually exclusive of the assigned respective portion of the array of memory cells of each remaining enabled operating mode of the two or more concurrently enabled operating modes.

20. The memory device of claim 14, wherein the controller is reconfigurable to operate the memory device using different sets of concurrently enabled operating modes of the plurality of selectively-enabled operating modes at different times.

\* \* \* \* \*